United States Patent
Wang et al.

(10) Patent No.: US 12,317,642 B2
(45) Date of Patent: May 27, 2025

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Zhao Wang, Zhejiang (CN); Jie Yang, Zhejiang (CN); Peiting Zheng, Zhejiang (CN); Ke Pa, Zhejiang (CN); Jinjin Chen, Zhejiang (CN); Lingxin Fang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/181,486

(22) Filed: Mar. 9, 2023

(65) Prior Publication Data
US 2024/0194800 A1    Jun. 13, 2024

(30) Foreign Application Priority Data
Dec. 7, 2022 (CN) .......................... 202211587455.9

(51) Int. Cl.
H10F 77/00 (2025.01)
H10F 77/30 (2025.01)

(52) U.S. Cl.
CPC ......... *H10F 77/935* (2025.01); *H10F 77/311* (2025.01)

(58) Field of Classification Search
CPC ......... H01L 31/02008; H01L 31/02167; H10F 77/935; H10F 77/311; H10F 77/14;
(Continued)

(56) References Cited

U.S. PATENT DOCUMENTS

| | | | |
|---|---|---|---|
| 4,886,555 A | 12/1989 | Hackstein et al. | |
| 2012/0012179 A1* | 1/2012 | Asaumi | H01L 31/0747 136/256 |

(Continued)

FOREIGN PATENT DOCUMENTS

| | | |
|---|---|---|
| AU | 2022246372 B1 | 9/2023 |
| CN | 101160668 A | 4/2008 |

(Continued)

OTHER PUBLICATIONS

Zhejiang Jinko Solar Co., Ltd., et al., Extended European Search Report, EP 231674623, Sep. 28, 2023.
(Continued)

*Primary Examiner* — Uyen M Tran
(74) *Attorney, Agent, or Firm* — USCH Law, PC

(57) ABSTRACT

Disclosed are a solar cell and a photovoltaic module. The solar cell includes a substrate, having a first surface, having a metal pattern region and a non-metal pattern region, a first passivation contact structure, located in the metal pattern region and including a first tunneling layer and a first doped conductive layer stacked in a direction away from the substrate, and a second passivation contact structure, including a second tunneling layer and a second doped conductive layer stacked in the direction away from the substrate, and having a first portion over the non-metal pattern region and a second portion over the first passivation contact structure, and a top surface of the first portion of the second passivation contact structure is not further away from the substrate than a top surface of the second portion of the second passivation contact structure.

19 Claims, 5 Drawing Sheets

(58) Field of Classification Search
CPC .... H10F 77/223; H10F 71/121; H10F 71/129; H10F 19/80; H10F 10/166
See application file for complete search history.

(56) References Cited

U.S. PATENT DOCUMENTS

| | | | |
|---|---|---|---|
| 2014/0170800 A1 | 6/2014 | Loscutoff et al. | |
| 2014/0338747 A1 | 11/2014 | Choi et al. | |
| 2015/0024541 A1 | 1/2015 | Jaffrennou et al. | |
| 2017/0301805 A1* | 10/2017 | Yamarin | H01L 31/022433 |
| 2019/0019904 A1 | 1/2019 | Westerberg et al. | |
| 2019/0312166 A1* | 10/2019 | Lu | H01L 31/0682 |
| 2021/0050467 A1* | 2/2021 | Kamikawa | H01L 31/03762 |

FOREIGN PATENT DOCUMENTS

| | | | |
|---|---|---|---|
| CN | 110071182 A | 7/2019 | |
| CN | 110265494 A * | 9/2019 | |
| CN | 110634999 A | 12/2019 | |
| CN | 110838536 A | 2/2020 | |
| CN | 211045452 U | 7/2020 | |
| CN | 211182223 U | 8/2020 | |
| CN | 111628049 A | 9/2020 | |
| CN | 111628050 A | 9/2020 | |
| CN | 112103364 A | 12/2020 | |
| CN | 112164728 A | 1/2021 | |
| CN | 112201700 A | 1/2021 | |
| CN | 112466961 A * | 3/2021 | H01L 31/02008 |
| CN | 213519985 U | 6/2021 | |
| CN | 113284961 A | 8/2021 | |
| CN | 113540269 A | 10/2021 | |
| CN | 113594304 A | 11/2021 | |
| CN | 113851555 A | 12/2021 | |
| CN | 113964216 A | 1/2022 | |
| CN | 114038922 A | 2/2022 | |
| CN | 215815893 U | 2/2022 | |
| CN | 114447161 A | 5/2022 | |
| CN | 216563157 U | 5/2022 | |
| CN | 216624298 U | 5/2022 | |
| CN | 114975691 A | 8/2022 | |
| CN | 217306520 U | 8/2022 | |
| CN | 115148828 A | 10/2022 | |
| CN | 115312633 A | 11/2022 | |
| CN | 115347059 A | 11/2022 | |
| CN | 115799358 A | 3/2023 | |
| EP | 4195299 A1 | 6/2023 | |
| JP | 2012028742 A | 2/2012 | |
| JP | 2012129533 A | 7/2012 | |
| JP | 2014204128 A * | 10/2014 | H01L 31/02167 |
| JP | 2015015472 A | 1/2015 | |
| JP | 2015185587 A | 10/2015 | |
| JP | 2016006841 A * | 1/2016 | H01L 31/02167 |
| JP | 2017069462 A | 4/2017 | |
| JP | 2018082157 A | 5/2018 | |
| JP | 2018120979 A | 8/2018 | |
| JP | 2018164057 A | 10/2018 | |
| JP | 6453468 B2 | 1/2019 | |
| JP | 2021057436 A | 4/2021 | |
| KR | 20130037395 A | 4/2013 | |
| KR | 1020140143279 A | 12/2014 | |
| KR | 20150104431 A | 9/2015 | |
| WO | 02075816 A1 | 9/2002 | |
| WO | 2017168910 A1 | 10/2017 | |
| WO | 2022073627 A1 | 4/2022 | |
| WO | 2022073628 A1 | 4/2022 | |
| WO | 2022199883 A2 | 9/2022 | |

OTHER PUBLICATIONS

Zhejiang Jinko Solar Co., LTD., et al., Extended European Search Report, EP 231622275, Aug. 29, 2023, 10 pgs.
Zhejiang Jinko Solar Co., LTD., et al., Extended European Search Report, EP 231644091 Sep. 4, 2023, 10 pgs.
Zhejiang Jinko Solar Co., Ltd., et al., JP Notice of Reasons for Refusal with English translation, JP 2024-008594, Jul. 16, 2024, 12 pgs.
Sugiura, T., et al., "Advanced Industrial Tunnel Oxide Passivated Contact Solar Cell by the Rear-Side Local Carrier-Selective Contact", IEEE Transactions on Electron Devices, vol. 69, No. 5, May 2022, 7 pgs.
Sugiura, T., et al., "Back-Contact Interdigitated Carrier-Selective Cell: Numerical Demonstration of 30mW/cm2 Output Power Density in Standard Albedo Condition", IEEE Transactions on Electron Devices, vol. 69, No. 12, Dec. 2022, 4 pgs.
Zhejiang Jinko Solar Co., Ltd et al., Examination report No. 1 for standard patent application, AU 2023202291, Mar. 13, 2023, 11 pgs.
Zhejiang Jinko Solar Co., Ltd., et al., Examination report No. 1 for standard patent application, AU 2023201692, Feb. 26, 2024, 5 pgs.
Zhejiang Jinko Solar Co., Ltd., et al., Examination report No. 1 for standard patent application, AU 2023201866, Jan. 30, 2024, 6 pgs.
Zhejiang Jinko Solar Co., Ltd., et al., Notice of Reasons for Refusal (with English translation), JP 2023-053019, Jun. 22, 2023, 6 pgs.
Zhejiang Jinko Solar Co., Ltd., et al., Decision to Grant a Patent (with English translation), JP 2023-053019, Jun. 22, 2023, 5 pgs.

* cited by examiner

SOLAR CELL AND PHOTOVOLTAIC MODULE

CROSS REFERENCE TO RELATED APPLICATIONS

This application claims priority to Chinese Patent Application No. CN202211587455.9, entitled "SOLAR CELL AND PHOTOVOLTAIC MODULE," filed on Dec. 7, 2022, which is incorporated herein by reference in its entirety.

TECHNICAL FIELD

The various embodiments described in this document relate in general to the field of solar cells, and in particular to a solar cell and a photovoltaic module.

BACKGROUND

Solar cells have excellent photoelectric conversion capability. In a tunnel oxide passivated contact (hereinafter TOPCON) cell, a tunneling oxide layer and a doped conductive layer are prepared on one surface of a substrate to suppress carrier recombination at the surface of the substrate in the solar cell and to enhance the passivation effect on the substrate. The tunneling oxide layer has good chemical passivation effect and the doped conductive layer has good field passivation effect. Furthermore, in order to transport and collect the photo-generated carriers from the solar cell, a metal paste coated on a metal pattern region is treated by using a sintering process such that the metal paste is burned through into the doped conductive layer, forming a front electrode. The front electrode is in electrical contact with the doped conductive layer to collect the carriers in the doped conductive layer.

However, the existing solar cells have the problem of low photoelectric conversion efficiency.

SUMMARY

Embodiments of the present disclosure provide a solar cell and a photovoltaic module, which are at least beneficial to improve the photoelectric conversion efficiency of the solar cell.

Some embodiments of the present disclosure provide a solar cell. The solar cell includes a substrate. The substrate has a first surface, and the first surface has a metal pattern region and a non-metal pattern region. The solar cell includes a first passivation contact structure, located in the metal pattern region of the first surface. The first passivation contact structure includes a first tunneling layer and a first doped conductive layer stacked in a direction away from the substrate. The solar cell includes a second passivation contact structure. The second passivation contact structure has a first portion over the non-metal pattern region of the first surface and a second portion over the first passivation contact structure. A top surface of the first portion of the second passivation contact structure is not further away from the substrate than a top surface of the second portion of the second passivation contact structure. The second passivation contact structure includes a second tunneling layer and a second doped conductive layer stacked in the direction away from the substrate.

In some embodiments, a concentration of a doped element in the first doped conductive layer is greater than or equal to a concentration of a doped element in the second doped conductive layer.

In some embodiments, a slope of a doping curve representing variation of doping concentration along a doping depth of the first doped conductive layer is less than a slope of a doping curve of the second doped conductive layer.

In some embodiments, the first doped conductive layer has a concentration of a doped element in a range of $5\times10^{18}$ atoms/cm$^3$ to $1\times10^{21}$ atoms/cm$^3$, and the second doped conductive layer has a concentration of a doped element in a range of $5\times10^{18}$ atoms/cm$^3$ to $9\times10^{20}$ atoms/cm$^3$.

In some embodiments, the first doped conductive layer has a thickness greater than or equal to a thickness of the second doped conductive layer.

In some embodiments, the first doped conductive layer has a thickness in a range of 5 nm to 500 nm, and the second doped conductive layer has a thickness in a range of 1 nm to 200 nm.

In some embodiments, the first tunneling layer has a thickness less than or equal to a thickness of the second tunneling layer.

In some embodiments, the first tunneling layer has a thickness in a range of 0.1 nm to 5 nm, and the second tunneling layer has a thickness in a range of 0.2 nm to 10 nm.

In some embodiments, the substrate has a second surface opposite to the first surface. The first surface has a height in the non-metal pattern region lower than a height in the metal pattern region, and the height in the non-metal pattern region and the height in the metal pattern region are relative to the second surface.

In some embodiments, a height difference between the height in the non-metal pattern region and the height in the metal pattern region is a range of 0.1 μm to 10 μm.

In some embodiments, the top surface of the first portion of the second passivation contact structure is lower than the top surface of the second portion of the second passivation contact structure.

In some embodiments, the second passivation contact structure further includes: a third portion, adjacent to the first portion and the second portion. The first portion covers the non-metal pattern region of the first surface, the second portion covers side surfaces and a top surface of the first passivation contact structure, and the third portion is inclined relative to the first portion.

In some embodiments, an included angle between a surface of the third portion facing toward the substrate and the non-metal pattern region of the first surface is a range of 90° to 160°.

In some embodiments, the first passivation contact structure includes: a plurality of sub-first passivation contact structures sequentially stacked in the direction away from the substrate, and each of the plurality of sub-first passivation contact structures includes a first tunneling sub-layer and a first doped conductive sub-layer sequentially stacked in the direction away from the substrate.

In some embodiments, the second passivation contact structure includes: a plurality of sub-second passivation contact structures sequentially stacked in the direction away from the substrate, and each of the plurality of sub-second passivation contact structures includes a second tunneling sub-layer and a second doped conductive sub-layer sequentially stacked in the direction away from the substrate.

In some embodiments, the first passivation contact structure includes a plurality of sub-first passivation contact structures sequentially stacked in the direction away from the substrate, and each of the plurality of sub-first passivation contact structures includes a first tunneling sub-layer and a first doped conductive sub-layer sequentially stacked in the direction away from the substrate. The second passivation contact structure includes a plurality of sub-second passivation contact structures sequentially stacked in the direction away from the substrate, and each of the plurality of sub-second passivation contact structures includes a second tunneling sub-layer and a second doped conductive sub-layer sequentially stacked in the direction away from the substrate. The plurality of sub-first passivation contact structures and the plurality of sub-second passivation contact structures are alternately stacked in the direction away from the substrate.

In some embodiments, a roughness of the metal pattern region of the first surface is greater than a roughness of the non-metal pattern region of the first surface.

In some embodiments, the solar cell further includes a first electrode, which is electrically connected with the first doped conductive layer.

Some embodiments of the present disclosure provide a photovoltaic module, including a plurality of cell strings, each formed by connecting a plurality of solar cells. Each of the plurality of solar cells is the solar cell as mentioned above. The photovoltaic module includes encapsulation layers, configured to cover surfaces of the plurality of cell string, and cover plates, configured to cover surfaces of the encapsulation layers away from the plurality of cell string.

The technical solutions provided by the embodiments of the present disclosure at least have the following advantages.

In the technical solutions of the solar cell provided by the embodiments of the present disclosure, the first passivation contact structure is disposed in the metal pattern region and the second passivation contact structure is covered on the first passivation contact structure, such that the first passivation contact structure and the second passivation contact structure are stacked to form a large thickness. In an actual process of forming the metal electrode, it is difficult for the metal electrode to penetrate through the first passivation contact structure and the second passivation contact structure, thus reducing a probability that the metal electrode penetrates through to the substrate. Furthermore, a contact area between the metal electrode and the first and second passivation contact structures can be increased and a contact resistance can be decreased, which contributes to increase a collection capability of the metal electrode for the carriers.

On the other hand, the second passivation contact structure is covered on the non-metal pattern region of the first surface, such that the second passivation contact structure has passivation effect on the first surface in the non-metal pattern region and increases a capability of transporting carriers from the non-metal pattern region to the metal pattern region. Furthermore, the second passivation contact structure covers the top surface of the first passivation contact structure and the non-metal pattern region of the first surface at the same time, such that the second passivation contact structure is a continuous film layer which can improve the transverse transport performance of the second passivation contact structure, and further increase the carrier transport capability. The top surface of the second passivation contact structure in the non-metal pattern region is made not higher than the top surface of the second passivation contact structure in the metal pattern region. In this way, the thickness of the second passivation contact structure in the non-metal pattern region is made smaller to prevent the second passivation contact structure from generating strong parasitic absorption capability for incident light, contributing to improve the absorption utilization rate of the first surface in the non-metal pattern region for incident light.

BRIEF DESCRIPTION OF THE DRAWINGS

One or more embodiments are illustrated in combination with corresponding drawings. These illustrative descriptions do not constitute any limitation to the embodiments. The figures in the drawings do not constitute scale limitation unless otherwise indicated.

DETAILED DESCRIPTION OF THE EMBODIMENTS

Figure 1:
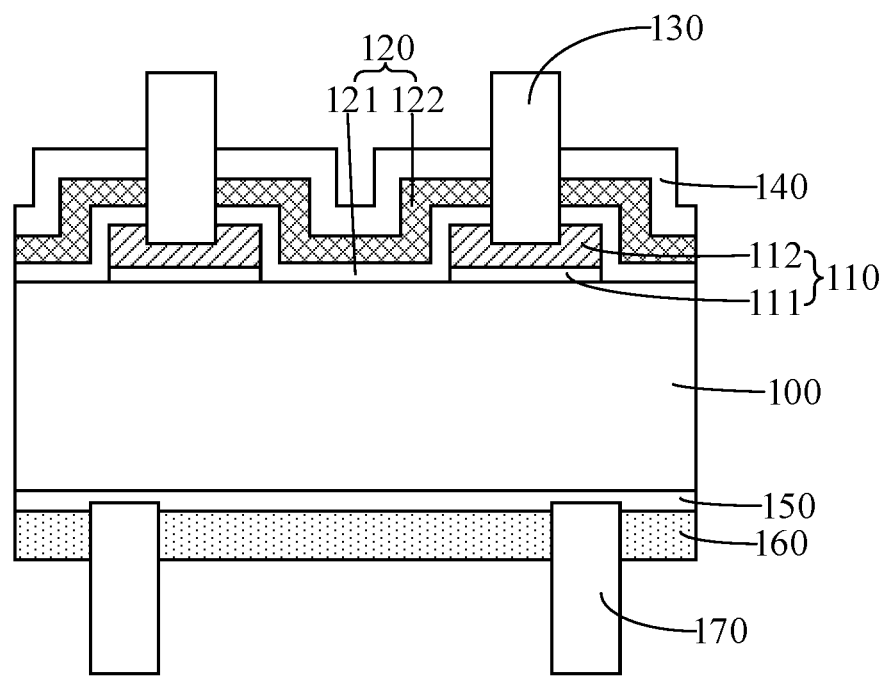
FIG. 1 is a schematic diagram illustrating a sectional structure of a first type of solar cell according to an embodiment of the present disclosure.

As mentioned in the background, the existing solar cells have the problem of low photoelectric conversion efficiency.

Analysis shows that one of the reasons for the low photoelectric conversion efficiency of the existing solar cells is that: the metal electrode is to be electrically connected with the doped conductive layer of the metal pattern region, and in order to enlarge a process window for a sintering process, the thickness of the doped conductive layer in the metal pattern region is made large, so as to reduce the probability that the metal electrode penetrates through the doped conductive layer. However, the doped conductive layer with a large thickness has strong parasitic absorption capability for incident light, which reduces the utilization rate of the incident light, and further restricts further improvement of the photoelectric conversion performance of the solar cell.

An embodiment of the present disclosure provides a solar cell. The solar cell includes a substrate. The substrate has a first surface and the first surface has a metal pattern region and a non-metal pattern region. The solar cell includes a first passivation contact structure and a second passivation contact structure. The first passivation contact structure is located in the metal pattern region. The second passivation contact structure includes a first portion over the non-metal pattern region of the first surface and a second portion over the first passivation contact structure. A top surface of the first portion of the second passivation contact structure is not further away from the substrate than a top surface of the second portion of the second passivation contact structure. The first passivation contact structure is disposed in the metal pattern region of the first surface and the second passivation contact structure is covered on the first passivation contact structure, such that the first passivation contact structure and the second passivation contact structure are stacked to form a large thickness. It is difficult for a metal electrode to penetrate through the first passivation contact structure and the second passivation contact structure, thus reducing a probability that the metal electrode penetrates through to the substrate. On the other hand, the second passivation contact structure is provided to cover a top surface of the first passivation contact structure and the non-metal pattern region of the first surface at the same time, such that the second passivation contact structure is provided as a continuous film layer, which can improve the transverse transport performance of the second passivation contact structure, enhance the capability of transporting carriers from the non-metal pattern region to the metal pattern region, and increase an open-circuit voltage and a short-circuit current. Furthermore, a top surface of the second passivation contact structure in the non-metal pattern region is made not higher than a top surface of the second passivation contact structure in the metal pattern region. In this way, the thickness of the second passivation contact structure in the non-metal pattern region is made smaller to prevent the second passivation contact structure from generating strong parasitic light absorption capability for incident light, thereby contributing to improve the absorption utilization rate of the non-metal pattern region of the first surface for incident light.

Detailed descriptions will be made below to the embodiments of the present disclosure in combination with accompanying drawings. However, persons of ordinary skill in the art may understand, in the embodiments of the present disclosure, many technical details are proposed to help readers to better understand the present disclosure. Without these technical details and various changes and modifications based on the following embodiments, the technical solutions claimed by the present disclosure can still be implemented.

FIG. 1 is a schematic diagram illustrating a sectional structure of a first type of solar cell according to an embodiment of the present disclosure.

By referring to FIG. 1, the solar cell includes a substrate 100. The substrate 100 has a first surface. The first surface has a metal pattern region and a non-metal pattern region. The solar cell includes a first passivation contact structure 110 which is located in the metal pattern region of the first surface. The first passivation contact structure 110 includes a first tunneling layer 111 and a first doped conductive layer 112 stacked in a direction away from the substrate. The solar cell includes a second passivation contact structure 120. The second passivation contact structure 120 covers a top surface of the first passivation contact structure 110 and the non-metal pattern region of the first surface. A top surface of the second passivation contact structure 120 located in the non-metal pattern region is not higher than a top surface of the second passivation contact structure 120 located in the metal pattern region. The second passivation contact structure 120 includes a second tunneling layer 121 and a second doped conductive layer 122 stacked in the direction away from the substrate 100.

The second passivation contact structure 120 is provided to cover the top surface of the first passivation contact structure 110 and the non-metal pattern region of the first surface at the same time, such that the first passivation contact structure 110 and the second passivation contact structure 120 located in the metal pattern region are stacked to form a large thickness. In this way, a probability that a metal electrode penetrates through to the substrate 100 during actual preparation can be reduced. Hence, generation of the recombination centers is diminished and good photoelectric conversion performance of the solar cell can be guaranteed. Further, carriers in the non-metal pattern region can be transported to the metal pattern region via the second passivation contact structure 120, thus contributing to collect the carriers and improve transverse transport performance.

In the embodiments of the present disclosure, the first passivation contact structure 110, which is disposed close to the substrate 100, is provided as a local passivation contact structure, whereas the second passivation contact structure 120, which is disposed away from the substrate 100, is right corresponding to the entire first surface. Compared with the solution in which the first passivation contact structure 110 disposed close to the substrate 100 covers the entire first surface and the second passivation contact structure 120 disposed away from the substrate 100 is right corresponding to the metal pattern region, absorption for incident light can be further enhanced while ensuring the carrier transport performance.

If the first passivation contact structure 110 disposed close to the substrate 100 covers the entire first surface and the second passivation contact structure 120 disposed away from the substrate 100 is right corresponding to the metal pattern region, the thickness of the second doped conductive layer 122 disposed at top layer is required to be set relatively smaller so as to reduce the parasitic absorption for incident light, and the thickness of the first doped conductive layer 112 is required to be set relatively larger so as to prevent the metal electrode from penetrating through, which leads to increased parasitic absorption capability of the first passivation contact structure 110 with exposed top surface in the non-metal pattern region for the incident light, and is not conducive to improvement of the utilization rate of the incident light. If the thickness of the second doped conductive layer 122 disposed at top layer is set larger to prevent the metal electrode from penetrating through, a parasitic absorption capability of the second doped conductive layer 122 for incident light may be increased. Hence, this structure cannot achieve balance over the thicknesses of the first doped conductive layer 112 and the second doped conductive layer 122, leading to inability to improve the utilization rate of the incident light and the transport capability of the carriers at the same time.

In embodiments of the present disclosure, since the second passivation contact structure 120 disposed at top layer is provided to cover the first passivation contact structure 110 and the first surface at the same time, the thickness of the second doped conductive layer 122 can be set smaller so as to reduce the parasitic absorption of the second doped conductive layer 122 for incident light, and the thickness of the first passivation contact structure 110 disposed close to the substrate 100 can be set larger so as to prevent the metal electrode from penetrating through the first passivation contact structure 110 and the second passivation contact structure 120. Since the first passivation contact structure 110 is covered by the second passivation contact structure 120, a parasitic absorption of the first passivation contact structure 110 for incident light cannot be increased even if the first passivation contact structure 110 has a larger thickness. Hence, the absorptivity for the incident light can be improved while guaranteeing the carrier transport performance.

In embodiments of the present disclosure, after the first passivation contact structure 110 and the second passivation contact structure 120 are stacked, the second passivation contact structure 120 is configured to achieve the effect of reducing the parasitic absorption for incident light and enhancing the transverse transport of the carriers, and the first passivation contact structure 110 is configured to achieve the effect of reducing the probability that the metal electrode penetrates through the substrate 100. In this way, the photoelectric conversion performance of the solar cell can be entirely improved.

The substrate 100 is configured to receive incident light and generate photo-generated carriers. In some embodiments, the substrate 100 may be a silicon substrate, and a material of the silicon substrate may include at least one of monocrystalline silicon, polycrystalline silicon, amorphous silicon or microcrystalline silicon. In some embodiments, the material of the substrate 100 may also be silicon carbide, organic material or poly-compound. The poly-compound may include, but not limited to, perovskite, gallium arsenide, cadmium telluride, copper indium diselenide, and the like.

In some embodiments, the solar cell is a Tunnel Oxide Passivated Contact (TOPCON) cell, the substrate 100 has a second surface opposite to the first surface, and the first surface and the second surface of the substrate 100 both may be configured to receive incident light or reflective light. In some embodiments, the substrate 100 has a doped element, and the type of the doped element is N type or P type. The N type element may be V group element such as phosphorus (P) element, bismuth (Bi) element, antimony (Sb) element, or arsenic (As) element, and the P type element may be III group element such as boron (B) element, aluminum (Al) element, gallium (Ga) element or indium (In) element. For example, when the substrate 100 is a P type substrate, the type of the doped element in the substrate is P type. Alternatively, when the substrate 100 is a N type substrate, the type of the doped element in the substrate is N type.

The first doped conductive layer 112 and the second doped conductive layer 122 have the effect of field passivation, such that minority carriers escape from an interface so as to reduce a concentration of the minority carriers. Thus, the carrier recombination rate at the interface of the substrate 100 is reduced, and an open circuit voltage, a short circuit current and a fill factor of the solar cell are increased, thereby improving the photoelectric conversion performance of the solar cell.

In some embodiments, the solar cell further includes a first electrode 130 which is in electrical connection with the first doped conductive layer 112. The first electrode 130 may penetrate through the second passivation contact structure 120 to be in electrical contact with the first doped conductive layer 112. The photo-generated carriers generated in the substrate 100 are transported to the first doped conductive layer 112 and the second doped conductive layer 122 from the substrate 100, and then transported to the first electrode 130 which is configured to collect the photo-generated carriers. The first electrode 130 is disposed in the metal pattern region. In practical preparation process, the first electrode 130 needs to have a large sintering depth to be in electrical contact with the first doped conductive layer 112. Since the first passivation contact structure 110 and the second passivation contact structure 120 are disposed in the metal pattern region, the first electrode 130 cannot easily penetrate through the first doped conductive layer 112 to be in contact with the first tunneling layer 111 or the substrate 100, thereby improving the process reliability and the yield of the prepared solar cells.

Furthermore, the first electrode 130 penetrates through the second passivation contact structure 120 such that a contact area between the first electrode 130 and the first and second passivation contact structures can be increased, thus reducing a metal contact recombination loss between the first electrode 130 and the first and second doped conductive layers, and further reducing carrier contact recombination between the first electrode 130 and the first and second doped conductive layers. Since the second doped conductive layer 122 and the first doped conductive layer 112 both have the effect of carrier transport, the first electrode 130 can collect the carriers from the first doped conductive layer 112 and the second doped conductive layer 122 at the same time, thus increasing the number of the collected carriers, and increasing the short circuit current and improving the photoelectric conversion performance of the solar cell.

In some embodiments, the type of the doped element of the first doped conductive layer 112 is identical to the type of the doped element of the second doped conductive layer 122, and identical to the type of the doped element of the substrate 100, such that the carriers can be smoothly transported from the substrate 100 to the first doped conductive layer 112 and the second doped conductive layer 122. Furthermore, metal contact recombination loss between the first electrode 130 and the first and second doped conductive layers can be reduced, and carrier contact recombination between the first electrode 130 and the first and second doped conductive layers can be further reduced, thus increasing the short circuit current and improving the photoelectric conversion performance of the solar cell.

In some embodiments, a concentration of the doped element in the first doped conductive layer 112 is greater than or equal to a concentration in the doped element of the second doped conductive layer 122. In some embodiments, the concentration of the doped element in the first doped conductive layer 112 and the concentration of the doped element in the second doped conductive layer 122 both are greater than a concentration of the doped element in the substrate 100, such that the first doped conductive layer 112 and the second doped conductive layer 122 form a heavily-doped region relative to the substrate 100. The heavily-doped region and the substrate 100 form a high-low junction which enables the carriers to generate a barrier effect. Thus, the transport rate and the number of the carriers transported from the substrate 100 to the first doped conductive layer 112 and the second doped conductive layer 122 are increased, and hence the first electrode 130 can collect the carriers effectively.

In some embodiments, the concentration of the doped element in the first doped conductive layer 112 may be greater than the concentration of the doped element in the second doped conductive layer 122. The first doped conductive layer 112 is located in the metal pattern region and in electrical contact with the first electrode 130. By setting the concentration of the doped element in the first doped conductive layer 112 larger, the barrier effect of the carriers can be further enhanced, so as to increase a tunneling probability of the carriers in the substrate 100 as well as the carrier concentration of the first doped conductive layer 112, helping the first electrode 130 to collect more carriers.

The second doped conductive layer 122 covers the non-metal pattern region of the first surface. By setting the concentration of the doped element in the second doped conductive layer 122 less, generation of auger recombination at the non-metal pattern region of the first surface may be reduced, and recombination of the carriers at the non-metal pattern region of the first surface is further reduced, and thus the passivation effect on the surface of the non-metal pattern region is improved, helping to further increase the number of the carriers, the open circuit voltage and the short circuit current.

Figure 2:
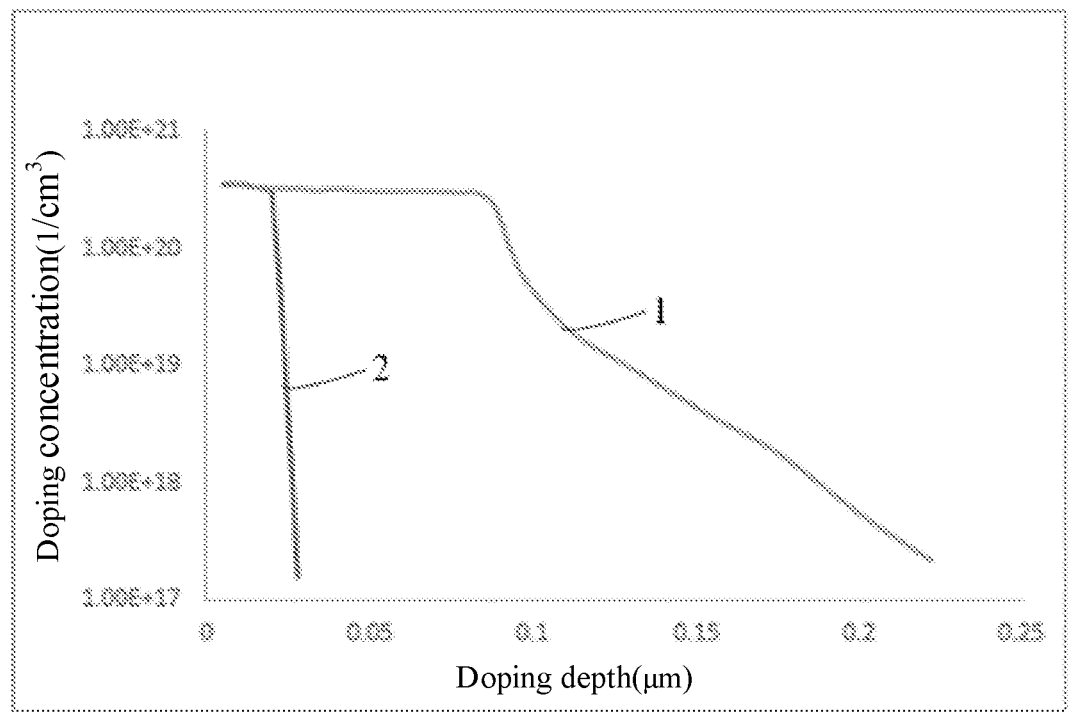
FIG. 2 is a doping curve of a solar cell according to an embodiment of the present disclosure.

By referring to FIGS. 1 and 2, in some embodiments, a slope of a doping curve of the first doped conductive layer 112 is less than a slope of a doping curve of the second doped conductive layer 122. The slope of the doping curve refers to a slope of a curve in which the doping concentration of the doped element in the first doped conductive layer 112 and the second doped conductive layer 122 changes along with a doping depth. In some embodiments, by using Electrochemical Capacitance Voltage (ECV) and Secondary Ion Mass Spectrometry (SIMS), a doping curve in which a concentration of an activated doped element and a concentration of a total injected doped element change along with a doping depth is obtained, where the sign 1 indicates a doping curve in which the concentration of the doped element of the first doped conductive layer 112 changes along with a doping depth, and the sign 2 indicates a doping curve in which the concentration of the doped element of the second doped conductive layer 112 changes along with a doping depth.

The slope of the doping curve of the first doped conductive layer 112 is set smaller, that is, along with increase of the doping depth in the first doped conductive layer 112, the concentration of the doped element in the first doped conductive layer 112 changes less. Namely, the concentration of the doped element in the first doped conductive layer 112 decreases slowly, such that the concentration of the doped element in the first doped conductive layer 112 is uniform, thus achieving a large concentration of the doped element in the first doped conductive layer 112.

The slope of the doping curve of the second doped conductive layer 122 is set larger, and along with increase of the doping depth in the second doped conductive layer 122, the concentration of the doped element in the second doped conductive layer 122 decreases much, such that the concentration of the doped element in the second doped conductive layer 122 is smaller.

In some embodiments, the concentration of the doped element in the first doped conductive layer 112 is $5 \times 10^{18}$ atoms/cm$^3$ to $1 \times 10^{21}$ atoms/cm$^3$, for example, may be $5 \times 10^{18}$ atoms/cm$^3$ to $7 \times 10^{18}$ atoms/cm$^3$, $7 \times 10^{18}$ atoms/cm$^3$ to $9 \times 10^{18}$ atoms/cm$^3$, $9 \times 10^{18}$ atoms/cm$^3$ to $1 \times 10^{19}$ atoms/cm$^3$, $1 \times 10^{19}$ atoms/cm$^3$ to $5 \times 10^{19}$ atoms/cm$^3$, $5 \times 10^{19}$ atoms/cm$^3$ to $1 \times 10^{20}$ atoms/cm$^3$, $1 \times 10^{20}$ atoms/cm$^3$ to $5 \times 10^{20}$ atoms/cm$^3$, or $5 \times 10^{20}$ atoms/cm$^3$ to $1 \times 10^{21}$ atoms/cm$^3$. In some embodiments, the concentration of the doped element in the second doped conductive layer 122 is $5 \times 10^{18}$ atoms/cm$^3$ to $9 \times 10^{20}$ atoms/cm$^3$, for example, may be $5 \times 10^{18}$ atoms/cm$^3$ to $7 \times 10^{18}$ atoms/cm$^3$, $7 \times 10^{18}$ atoms/cm$^3$ to $1 \times 10^{19}$ atoms/cm$^3$, $1 \times 10^{19}$ atoms/cm$^3$ to $5 \times 10^{19}$ atoms/cm$^3$, $5 \times 10^{19}$ atoms/cm$^3$ to $9 \times 10^{19}$ atoms/cm$^3$, $9 \times 10^{19}$ atoms/cm$^3$ to $1 \times 10^{20}$ atoms/cm$^3$, $1 \times 10^{20}$ atoms/cm$^3$ to $5 \times 10^{20}$ atoms/cm$^3$, or $5 \times 10^{20}$ atoms/cm$^3$ to $9 \times 10^{20}$ atoms/cm$^3$. Within this range, the concentration of the doped element in the first doped conductive layer 112 is set larger, so as to increase a tunneling capability of the carriers in the substrate 100 corresponding to the metal pattern region and improve the collection capability of the first electrode 130 for the carriers. Further, the concentration of the doped element in the first doped conductive layer 112 may not be set to excessively large, so as to avoid the problem that the auger recombination of the carriers is increased due to excessively large concentration of the doped element in the first doped conductive layer 112. In addition, the concentration of the doped element in the second doped conductive layer 122 is set to be within the range, such that the doping concentration of the second doped conductive layer 122 is smaller, thus ensuring a surface passivation capability of the second doped conductive layer 122 on the non-metal pattern region of the first surface.

In some embodiments, the concentration of the doped element in the first doped conductive layer 112 may also be identical to the concentration of the doped element in the second doped conductive layer 122.

In some embodiments, a thickness of the first doped conductive layer is greater than or equal to a thickness of the second doped conductive layer 122.

In some embodiments, the thickness of the first doped conductive layer 112 is greater than the thickness of the second doped conductive layer 122. By setting the thickness of the first doped conductive layer 112 larger, the probability that the first electrode penetrates through to the substrate 100 may be reduced and the contract area between the first doped conductive layer 112 and the first electrode 130 may also be increased. Further, a contact resistance is reduced, and a transport loss of transporting the carriers to the first electrode 130 is reduced, thereby contributing to increase the collection capability of the first electrode 130 for the carriers.

The second doped conductive layer 122 is located above the first doped conductive layer 112 and the non-metal pattern region of the first surface. By setting the thickness of the second doped conductive layer 122 smaller, parasitic absorption of the second doped conductive layer 122 for incident light may be reduced, and the absorption utilization rate of the substrate 100 for incident light is increased, and thus photoelectric conversion performance is improved. Since the first doped conductive layer 112 is covered by the second doped conductive layer 122, the first doped conductive layer 112 does not contact incident light directly and hence the thickness of the first doped conductive layer 112 may be set larger. Furthermore, since the first doped conductive layer 112 is only disposed in the metal pattern region, a smaller amount of incident light passes through the first doped conductive layer 112, and therefore, the first doped conductive layer 112 cannot have strong parasitic absorption for incident light. Thus, the absorption utilization rate for incident light can be improved while the carrier collection capability is improved.

In some embodiments, the thickness of the first doped conductive layer is 5 nm to 500 nm, for example, may be 5 nm to 10 nm, 10 nm to 50 nm, 50 nm to 80 nm, 80 nm to 100 nm, 100 nm to 150 nm, 150 nm to 200 nm, 200 nm to 250 nm, 250 nm to 300 nm, 300 nm to 350 nm, 350 nm to 400 nm, 400 nm to 450 nm or 450 nm to 500 nm. In some embodiments, the thickness of the second doped conductive layer 122 is 1 nm to 200 nm, for example, may be 1 nm to 5 nm, 5 nm to 10 nm, 10 nm to 30 nm, 30 nm to 50 nm, 50 nm to 80 nm, 80 nm to 100 nm, 100 nm to 130 nm, 130 nm to 150 nm, 150 nm to 170 nm, 170 nm to 185 nm or 185 nm to 200 nm. Within the above range, by setting the thickness of the first doped conductive layer 112 larger, the probability that the first electrode 130 penetrates through to the substrate 100 can be effectively reduced. Further, the thickness of the first doped conductive layer 112 may not be excessively large, such that the first doped conductive layer 112 does not generate excessively large stress for the metal pattern region of the first surface, thus avoiding excess surface defects generated on the metal pattern region of the first surface, and reducing generation of the carrier recombination centers, and increasing the number of the carriers.

The thickness of the second doped conductive layer 122 is set to be within the above range such that the thickness of the second doped conductive layer 122 is smaller, which reduces parasitic absorption of the second doped conductive layer 122 for incident light and increases the absorptivity of the substrate 100 for incident light.

In some embodiments, the thickness of the first doped conductive layer 112 may also be equal to the thickness of the second doped conductive layer 122.

In some embodiments, a material of the first doped conductive layer includes at least one of amorphous silicon, polycrystalline silicon, and silicon carbide. In some embodiments, a material of the second doped conductive layer 122 includes at least one of amorphous silicon, polycrystalline silicon, and silicon carbide. In some embodiments, the material of the first doped conductive layer may be same as the material of the second doped conductive layer 122. In some embodiments, the material of the first doped conductive layer 112 may be different from the material of the second doped conductive layer 122.

The first tunneling layer 111 and the second tunneling layer 121 are configured to perform interface passivation on the first surface to achieve the effect of chemical passivation. Specifically, by using dangling bonds of the saturated first surface, an interface defect state density of the first surface is decreased so as to lessen the recombination centers of the first surface.

In some embodiments, a thickness of the first tunneling layer 111 is less than or equal to a thickness of the second tunneling layer 121.

In some embodiments, the thickness of the first tunneling layer 111 may be less than the thickness of the second tunneling layer 121. The first tunneling layer 111 is in direct contact with the first surface in the metal pattern region to achieve tunneling of majority carriers and selective transport of the carriers. Due to the smaller thickness of the first tunneling layer 111, the carriers in the substrate 100 corresponding to the metal pattern region may more easily pass through the first tunneling layer 111, thereby increasing the tunneling probability of the carriers and further increasing the transport efficiency of the carriers. Furthermore, Since the first tunneling layer 111 has a smaller thickness, when the first tunnel layer 111 is deposited actually, the first tunneling layer 111 obtained by depositing has a high uniformity, which improves a contact section morphology between the first tunneling layer 111 and the first surface, facilitating the tunneling of the carriers.

The thickness of the second tunneling layer 121 is set larger, which makes it more difficult for the conductive paste for forming the first electrode 130 to burn through the second tunneling layer 121 during the process of preparing the first electrode 130, so as to control a sensitivity of corrosion of the conductive paste. When the thickness of the second tunneling layer 121 is larger, it is more difficult for the conductive paste to burn through the second tunneling layer 121, thereby lessening the sensitivity of corrosion of the conductive paste. In this way, the probability that the first electrode 130 penetrates through to the substrate 100 is further reduced, and the generation of the carrier recombination centers is lessened.

In some embodiments, the thickness of the first tunneling layer is 0.1 nm to 5 nm, for example, may be 0.1 nm to 0.5 nm, 0.5 nm to 0.8 nm, 0.8 nm to 1 nm, 1 nm to 1.5 nm, 1.5 nm to 2 nm, 2 nm to 2.5 nm, 2.5 nm to 3 nm, 3 nm to 3.5 nm, 3.5 nm to 4 nm, 4 nm to 4.5 nm or 4.5 nm to 5 nm. In some embodiments, the thickness of the second tunneling layer 121 is 0.2 nm to 10 nm, for example, may be 0.2 nm to 0.5 nm, 0.5 nm to 0.8 nm, 0.8 nm to 1.2 nm, 1.2 nm to 2 nm, 2 nm to 2.5 nm, 2.5 nm to 3 nm, 3 nm to 3.5 nm, 3.5 nm to 4 nm, 4 nm to 4.5 nm, 4.5 nm to 5 nm, 5 nm to 6 nm, 6 nm to 7 nm, 7 nm to 8 nm, 8 nm to 9 nm or 9 nm to 10 nm. Within the above range, on one hand, the thickness of the first tunneling layer 111 is set smaller, which contributes to improve the tunneling of the carriers in the substrate 100 corresponding to the metal pattern region, and within the above range, the thickness of the first tunneling layer 111 cannot be excessively small, which prevents the problem of formation of cavities in a deposition process due to small thickness.

Within the above range, the thickness of the second tunneling layer 121 is set larger. By adjusting the thickness of the second tunneling layer 121 to be larger, the sensitivity of burning-through of the conductive paste for preparing the first electrode 130 can be controlled, so as to reduce the probability that the first electrode 130 burns through to the substrate 100.

In some embodiments, the thickness of the first tunneling layer 111 may also be same as the thickness of the second tunneling layer 121.

In some embodiments, a material of the first tunneling layer 111 may be same as a material of the second tunneling layer 121.

In some embodiments, the material of the first tunneling layer 111 is different from the material of the second tunneling layer 121. By making the materials of the first tunneling layer 111 and the second tunneling layer 121 different, the respective functions of the first tunneling layer 111 and the second tunneling layer 121 can be enhanced. For example, the tunneling effect of the carriers for the first tunneling layer 111 can be enhanced and the blocking effect of the second tunneling layer 121 for the burning-through of the first electrode 130 can be enhanced.

In some embodiments, the material of the first tunneling layer 111 includes at least one of silicon oxide, aluminum oxide, silicon nitride, silicon oxynitride, amorphous silicon or polycrystalline silicon. In some embodiments, the material of the second tunneling layer 121 includes at least one of silicon oxide, aluminum oxide, silicon nitride, silicon oxynitride, amorphous silicon or polycrystalline silicon.

In some embodiments, a pinhole density of the material of the first tunneling layer 111 is less than a pinhole density of the material of the second tunneling layer 121. Due to smaller pinhole density of the material of the first tunneling layer 111, the probability that the carriers pass through the first tunneling layer 111 is increased. Due to the larger pinhole density of the material of the second tunneling layer 121, the burning-through capability of the conductive paste for preparing the first electrode 130 may be further reduced, and the penetration probability of the first electrode 130 may be decreased, and the defect state density of the second tunneling layer 121 may be reduced, and thus the passivation performance of the second tunneling layer 121 for the non-metal pattern region of the first surface is improved. In view of this, in some embodiments, the material of the first tunneling layer 111 may be silicon nitride and the material of the second tunneling layer 121 may be silicon oxide.

Figure 3:
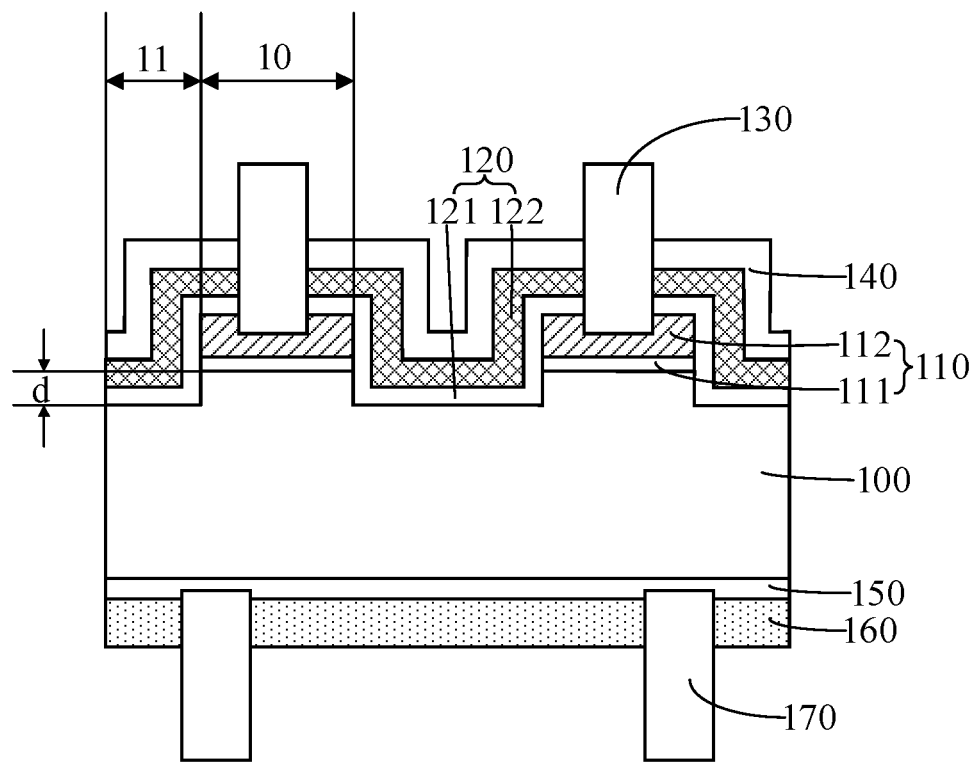
FIG. 3 is a schematic diagram illustrating a sectional structure of a second type of solar cell according to an embodiment of the present disclosure.

By referring to FIG. 3, in some embodiments, a height in the non-metal pattern region 11 of the first surface is lower than a height in the metal pattern region 10 of the first surface. That is, a step structure is formed between the first surface in the non-metal pattern region 11 and the first surface in the metal pattern region 10. Compared with a manner that the first surface in the non-metal pattern region 11 is flushed with the first surface in the metal pattern region 10, a surface area of the first surface is increased, and thus surface areas of the second tunneling layer 121 and the second doped conductive layer 122 covering the first surface in the non-metal pattern region 11 and the top surface of the first passivation contact structure 110 are increased. In this way, the area of the second tunneling layer 121 can be increased without increasing the cross-sectional area of the first surface of the substrate 100, a larger tunneling channel for the carriers can be provided, and thus the number of the transported carriers can be increased. The cross-sectional area herein refers to a sectional area in a direction parallel to the first surface of the substrate 100.

It is worth noting that the height in the non-metal pattern region of the first surface and the height in the metal pattern region herein of the first surface both are relative to the second surface of the substrate 100, that is, a thickness of the substrate corresponding to the non-metal pattern region 11 is less than a thickness of the substrate corresponding to the metal pattern region 10.

In some embodiments, a height difference d between the height of the first surface in the non-metal pattern region 11 and the height of the first surface in the metal pattern region 10 is 0.1 µm to 10 µm, for example, may be 0.1 µm to 0.2 µm, 0.2 µm to 1 µm, 1 µm to 1.5 µm, 1.5 µm to 2 µm, 2 µm to 2.5 µm, 2.5 µm to 3 µm, 3 µm to 3.1 µm, 3.1 µm to 3.2 µm, 3.2 µm to 3.5 µm, 3.5 µm to 3.8 µm, 3.8 µm to 3.9 µm, 3.9 µm to 4 µm, 4 µm to 4.5 µm, 4.5 µm to 5 µm, 5 µm to 5.5 µm, 5.5 µm to 6 µm, 6 µm to 6.5 µm, 6.5 µm to 7 µm, 7 µm to 7.5 µm, 7.5 µm to 8 µm, 8 µm to 8.5 µm, 8.5 µm to 9 µm or 9 µm to 10 µm. Within this height range, the height difference d between the height of the first surface in the non-metal pattern region 11 and the height of the first surface in the metal pattern region 10 can be set larger, which contributes to increase the surface area of the first surface, and further increase the areas of the second tunneling layer 121 and the second doped conductive layer 122, thus providing a larger tunneling channel for the carriers and enhancing the transport of the carriers. On the other hand, the height difference d between the height of the first surface in the non-metal pattern region 11 and the height of the first surface in the metal pattern region 10 cannot be excessively large, which avoids the problem of an increased defect state density of the first surface of the substrate 100 resulting from excessive loss of the substrate 100 in an actual process of forming the height difference, thereby ensuring less carrier recombination at the first surface of the substrate 100.

By referring to FIG. 3, in some embodiments, the top surface of the second passivation contact structure 120 located in the non-metal pattern region 11 may be lower than the top surface of the second passivation contact structure 120 located in the metal pattern region 10. That is, the top surface of the second passivation contact structure 120 located on the first surface in the non-metal pattern region 11 is lower than the top surface of the second passivation contact structure 120 located in the metal pattern region 10. In this case, on one hand, the second passivation contact structure 120 in the non-metal pattern region 11 is prevented from bringing stress damage to the first surface in the non-metal pattern region 11 due to excessively large thickness, and thus no surface defects can be brought to the first surface in the non-metal pattern region 11, and further, generation of excess carrier recombination centers can be avoided. On the other hand, the thickness of the second doped conductive layer 122 cannot be excessively large, which reduces parasitic absorption of the second doped conductive layer 122 for incident light.

Figure 4:
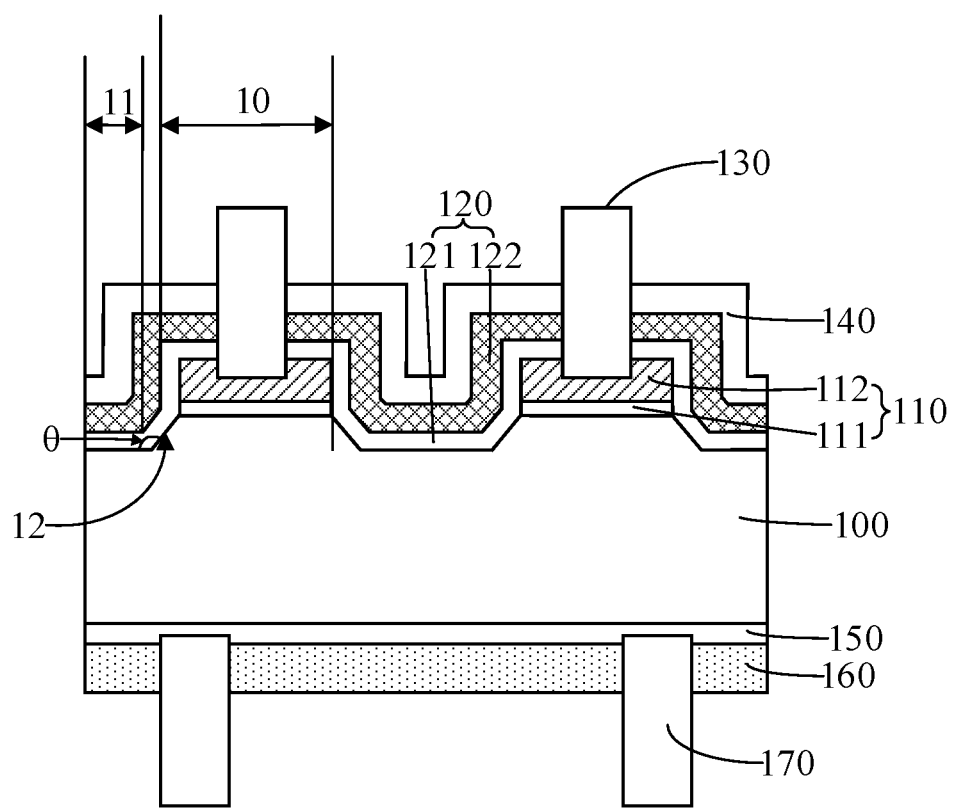
FIG. 4 is a schematic diagram illustrating a sectional structure of a third type of solar cell according to an embodiment of the present disclosure.

By referring to FIG. 4, in some embodiments, the second passivation contact structure includes: a first portion, a second portion and a third portion, which are sequentially adjacent to each other. The first portion covers the non-metal pattern region 11 of the first surface, the second portion covers side surfaces and a top surface of the first passivation contact structure 110, and the third portion is inclined relative to the first portion. That is, the second passivation contact structure 120 is a continuous film layer, which can improve transverse transport of the carriers in the second passivation contact structure 120.

In some embodiments, the first surface includes a transitional region 12 which is located between the metal pattern region 10 and the non-metal pattern region 11, and the metal pattern region 10, the non-metal pattern region 11 and the transitional region 12 form a step structure. The third portion is located on the transitional region 12. The third portion may be served as a transitional portion of the second passivation contact structure 120. Compared with the first surface being a plane, due to presence of the third portion, the area of the second passivation contact structure 120 can be increased and further the transport channel of the carriers can be increased. The transitional region 12 is disposed adjacent to the metal pattern region while the first passivation contact structure 110 is located in the metal pattern region of the first surface such that the third portion is adjacent to the metal pattern region. Thus, the carriers in the third portion can be transported to the first electrode 130 over a shorter distance, thereby reducing the transport loss and increasing the number of transported carriers.

Furthermore, the presence of the transitional region 12 can increase the area of the first surface and thus a roughness of the first surface in the non-metal pattern region can be reduced, such that the first surface in the non-metal pattern region is relatively smooth. When the second passivation contact structure 120 is actually prepared, the second passivation contact structure 120 can be uniformly deposited on the first surface in the non-metal pattern region such that the second passivation contact structure 120 is smooth, contributing to increase the surface passivation performance of the second passivation contact structure 120 for the first surface in the non-metal pattern region.

Based on the above considerations, in some embodiments, a roughness of the first surface in the metal pattern region may be greater than the roughness of the first surface in non-metal pattern region. By setting the roughness of the first surface in the metal pattern region larger, the areas of the surface of the first passivation contact structure 110 and the surface of the second passivation contact structure 120 located in the metal pattern region can be increased, so as to increase the contact area between the first electrode 130 and the first and second passivation contact structures, reduce a contact resistance of the first electrode 130, and improve the transport performance of the carriers.

By setting the roughness of the non-metal pattern region of the first surface smaller, the second passivation contact structure 120 covering the non-metal pattern region 11 of the first surface can be relatively smooth, which can improve the surface passivation capability of the second passivation contact structure 120 for the first surface in the non-metal pattern region 11.

Compared with the fact that the third portion is perpendicular to the first surface, assuming that the height difference between the first surface in the non-metal pattern region 11 and the first surface in the metal pattern region 10 is given, the third portion is disposed to be inclined relative to the first portion such that the surface area of the third portion can be increased. Therefore, by controlling an included angle between a surface of the third portion facing toward the substrate 100 and the first surface, the surface area of the third portion can be adjusted. Based on this, in some embodiments, the included angle θ between the surface of the third portion facing toward the substrate 100 and the first surface in the non-metal pattern region is in a range of 90° to 160°, for example, may be 90° to 95°, 95° to 100°, 100° to 105°, 105° to 110°, 110° to 115°, 115° to 120°, 120° to 125°, 125° to 130°, 130° to 135°, 135° to 140°, 140° to 145°, 145° to 150°, 150° to 155° or 155° to 160°. Within the range, the third portion can have a larger surface area. Further, within this range, the included angle between the surface of the third portion facing toward the substrate 100 and the first surface cannot be excessively small, which ensures formation of the step structure.

In some embodiments, the first passivation contact structure 110 may only include one first tunneling layer 111 and one first doped conductive layer 112, and the first tunneling layer 111 is in direct contact with the first surface.

Figure 5:
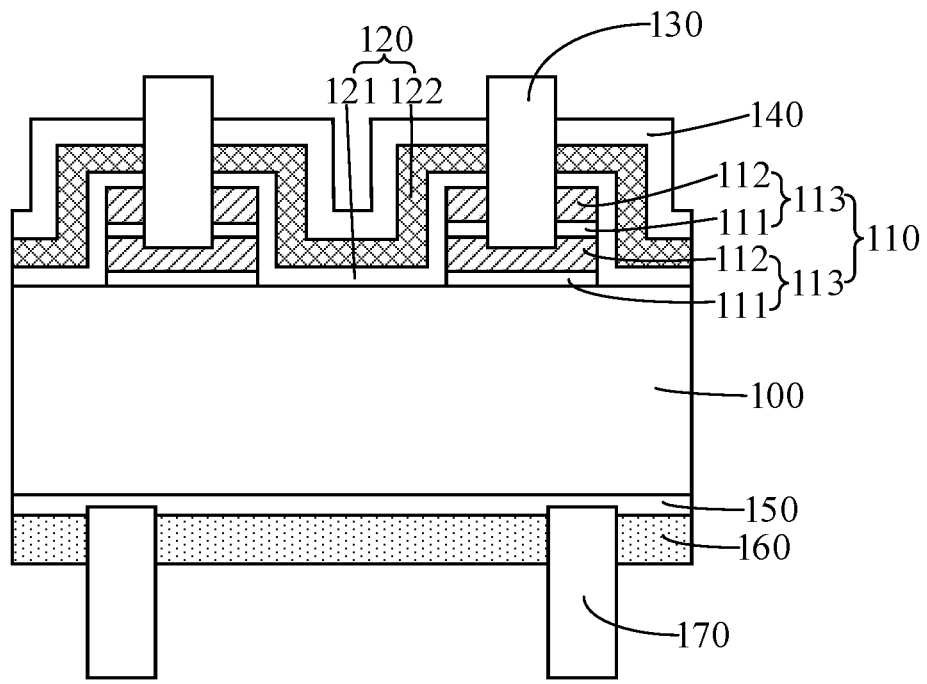
FIG. 5 is a schematic diagram illustrating a sectional structure of a fourth type of solar cell according to an embodiment of the present disclosure.

By referring to FIG. 5, in some embodiments, the first passivation contact structure 110 may also include: a plurality of sub-first passivation contact structures 113 sequentially stacked in a direction away from the substrate 100, and each of the plurality of sub-first passivation contact structures 113 includes a first tunneling layer 111 and a first doped conductive layer 112 sequentially stacked in the direction away from the substrate 100. Namely, the first passivation contact structure 110 may include a plurality of first tunneling layers 111 and a plurality of first doped conductive layers 112, where the plurality of first tunneling layers 111 and the plurality of first doped conductive layers 112 are alternately stacked. FIG. 5 shows two sub-first passivation contact structures 113.

In some embodiments, the second passivation contact structure 120 may only include one second tunneling layer 121 and one second doped conductive layer 122, and the second tunneling layer 121 covers the top surface of the first passivation contact structure 110 and the first surface in the non-metal pattern region. In some embodiments, when the second passivation contact structure 120 only includes one second tunneling layer 121 and one second doped conductive layer 122, the first passivation contact structure 110 may include a plurality of sub-first passivation contact structures 113, or only include one first tunneling layer 111 and one first doped conductive layer 112, as long as the second passivation contact structure 120 can wrap the first passivation contact structure 110.

Figure 6:
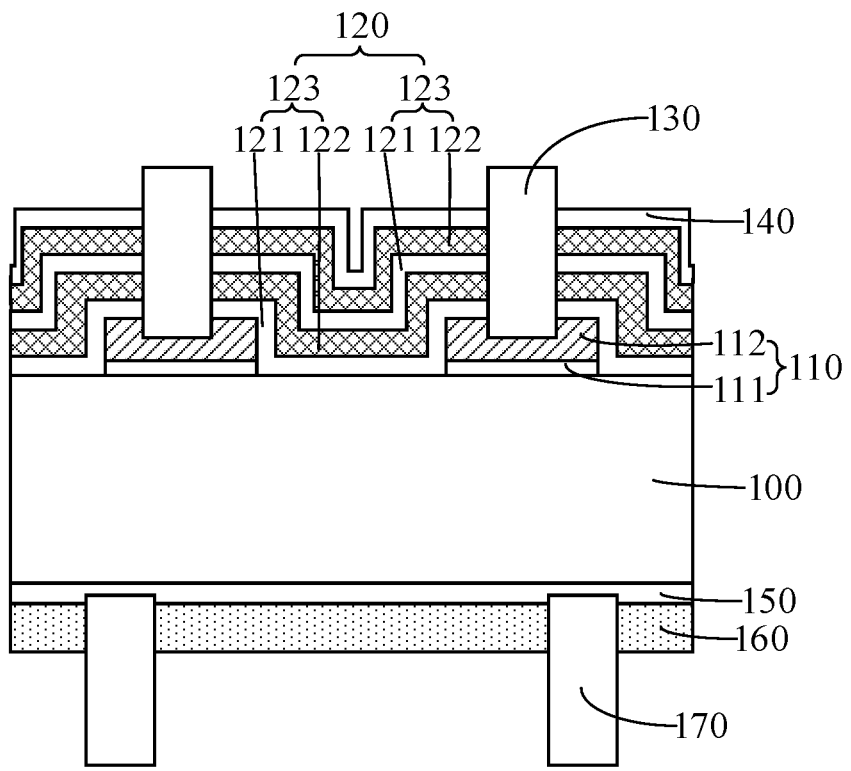
FIG. 6 is a schematic diagram illustrating a sectional structure of a fifth type of solar cell according to an embodiment of the present disclosure.

By referring to FIG. 6, in some embodiments, the second passivation contact structure 120 may also include a plurality of sub-second passivation contact structures 123 sequentially stacked in a direction away from the substrate 100, and each of the plurality of sub-second passivation contact structures 123 may include a second tunneling layer 121 and a second doped conductive layer 122 sequentially stacked in the direction away from the substrate 100. Namely, the second passivation contact structure 120 may include a plurality of second tunneling layers 121 and a plurality of second doped conductive layers 122, where the plurality of second tunneling layers 121 and the plurality of second doped conductive layers 122 are alternately stacked. FIG. 6 shows two sub-second passivation contact structures 123.

Figure 7:
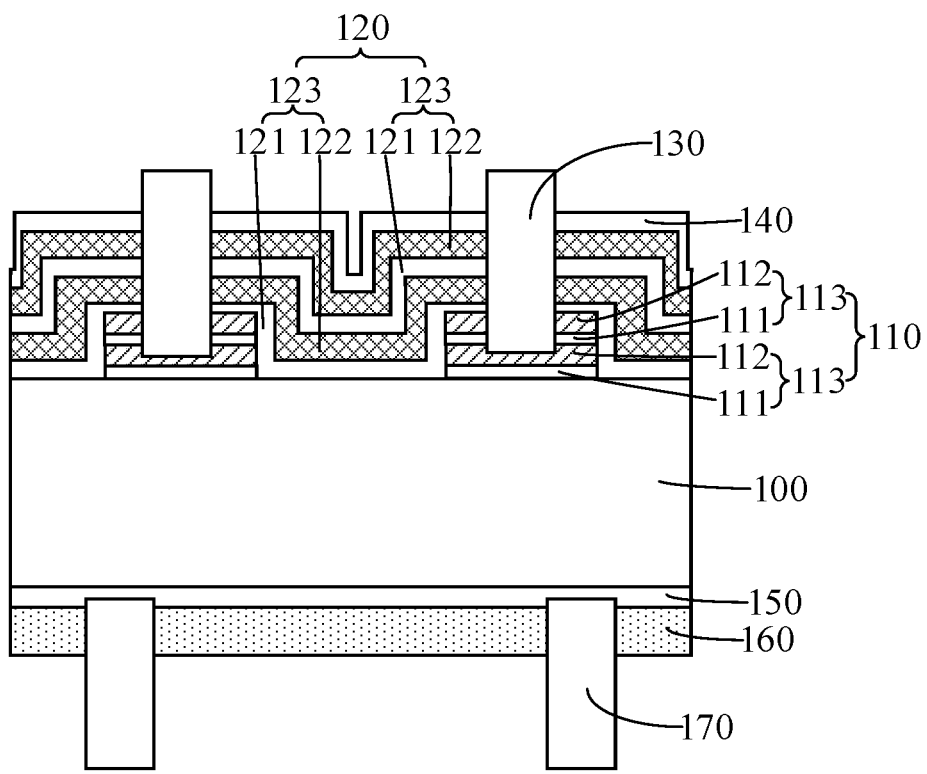
FIG. 7 is a schematic diagram illustrating a sectional structure of a sixth type of solar cell according to an embodiment of the present disclosure.

As shown in FIG. 6, in some embodiments, the second passivation contact structure 120 includes a plurality of sub-second passivation contact structures 123, the first passivation contact structure 110 may only include one first tunneling layer 111 and one first doped conductive layer 112. As shown in FIG. 7, the first passivation contact structure 110 may also include a plurality of sub-first passivation contact structures 113 as long as the second passivation contact structure 120 can wrap the first passivation contact structure 110.

Figure 8:
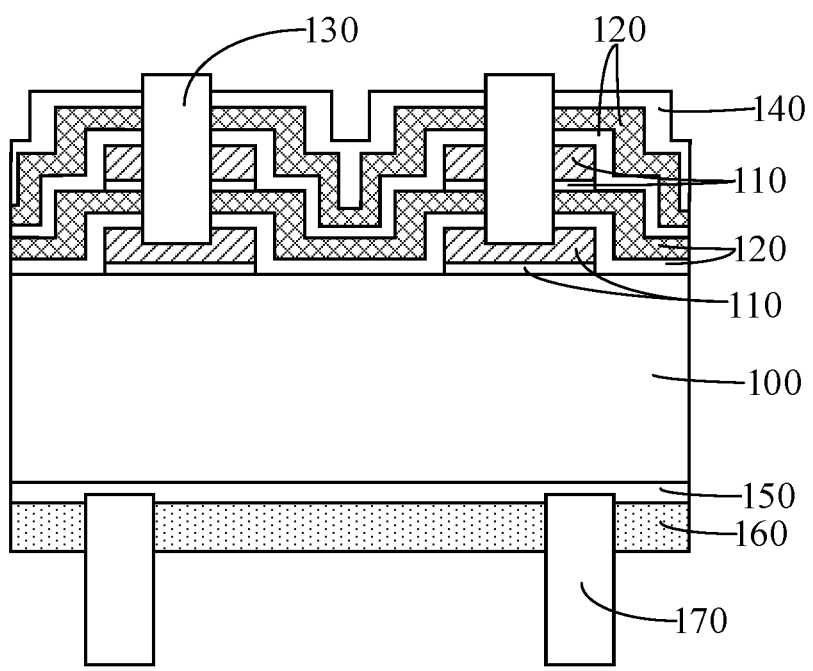
FIG. 8 is a schematic diagram illustrating a sectional structure of a seventh type of solar cell according to an embodiment of the present disclosure.

As shown in FIG. 8, in some embodiments, a plurality of first passivation contact structures and a plurality of second passivation contact structures 120 are disposed, where the plurality of first passivation contact structures 110 and the plurality of second passivation contact structures 120 are alternately stacked in a direction away from the substrate 100. Each of the plurality of second passivation contact structures 120 covers the top surface and the side surfaces of a respective first passivation contact structure 110, the second passivation contact structure 120 close to the substrate 100 covers the first surface in the non-metal pattern region, and the remaining second passivation contact structures 120 cover the top surface of a neighboring second passivation contact structure 120.

In some embodiments, when a plurality of first passivation contact structures 110 and a plurality of second passivation contact structures 120 are alternately stacked, the first passivation contact structure 110 may only include one first tunneling layer 111 and one first doped conductive layer 112 or may include a plurality of sub-first passivation contact structures 113, and the second passivation contact structure 120 may only include one second tunneling layer 121 and one second doped conductive layer 122 or may include a plurality of sub-second passivation contact structures 123.

Alternatively, in other words, tunneling layers and doped conductive layers included in the first and second passivation contact structures may include one layer or multiple sub-layers, as long as the first and second passivation contact structures are stacked to increase the thickness of the passivation contact structure. The detailed illustration is as follows.

In some embodiments, the first passivation contact structure 110 may only include one first tunneling layer 111 and one first doped conductive layer 112, and the second passivation contact structure 120 may only include one second tunneling layer 121 and one second doped conductive layer 122, as shown in FIGS. 1, 3 and 4.

In some embodiments, the first passivation contact structure 110 includes a plurality of sub-first passivation contact structures 113 sequentially stacked in the direction away from the substrate 100, and each of the plurality of sub-first passivation contact structures 113 includes a first tunneling sub-layer 111 and a first doped conductive sub-layer 112 sequentially stacked in the direction away from the substrate. FIG. 5 shows two sub-first passivation contact structures, and the second passivation contact structure 120 only including one second tunneling layer 121 and one second doped conductive layer 122.

In some embodiments, the second passivation contact structure 120 includes a plurality of sub-second passivation contact structures 123 sequentially stacked in the direction away from the substrate 100, and each of the plurality of sub-second passivation contact structures 123 includes a second tunneling sub-layer 111 and a second doped conductive sub-layer 112 sequentially stacked in the direction away from the substrate. FIG. 6 shows two sub-second passivation contact structures, and the first passivation contact structure 110 only including one second tunneling layer 111 and one second doped conductive layer 112.

In some embodiments, the first passivation contact structure 110 includes a plurality of sub-first passivation contact structures 113 sequentially stacked in the direction away from the substrate 100, and each of the plurality of sub-first passivation contact structures 113 includes a first tunneling sub-layer 111 and a first doped conductive sub-layer 112 sequentially stacked in the direction away from the substrate. The second passivation contact structure 120 includes a plurality of sub-second passivation contact structures 123 sequentially stacked in the direction away from the substrate 100, and each of the plurality of sub-second passivation contact structures 123 includes a second tunneling sub-layer 111 and a second doped conductive sub-layer 112 sequentially stacked in the direction away from the substrate. FIG. 7 shows two sub-first passivation contact structures and two sub-second passivation contact structures sequentially stacked, and FIG. 8 shows two sub-first passivation contact structures and two sub-second passivation contact structures alternately stacked.

When there are a plurality of sub-first passivation contact structures 113 and/or a plurality of sub-second passivation contact structures 123, correspondingly, there are a plurality of first tunneling sub-layers, a plurality of first doped conductive sub-layers, a plurality of second tunneling sub-layers, a plurality of second doped conductive sub-layers, respectively. In the preparing process of the solar cell, the plurality of sub-layers are considered as a whole and the configurations for the type of doping element, concentration of doping elements, slope of the doping curve, thickness and material in the above-mentioned embodiments also apply to the embodiments concerning about the plurality of sub-layers.

In some embodiments, the solar cell further includes a first passivation layer 140 which is located on a surface of the second passivation contact structure 120 away from the substrate 100. The first passivation layer 140 can achieve passivation effect on the first surface, for example, achieve good chemical passivation on dangling bonds of the first surface, so as to reduce a defect state density of the first surface and suppress the carrier recombination at the first surface.

In some embodiments, the first passivation layer 140 may be a single-layer structure. In some embodiments, the first passivation layer 140 may be a multi-layer structure. In some embodiments, a material of the first passivation layer 140 may be at least one of silicon oxide, aluminum oxide, silicon nitride, or silicon oxynitride.

In some embodiments, the first electrode 130 may penetrate through the first passivation layer 140 and the second passivation contact structure 120 to be in electrical contact with the first doped conductive layer 112.

In some embodiments, the solar cell further includes an emitter 150 which is located on the second surface of the substrate 100. The emitter 150 is contrary to the substrate 100 in the type of doped element and forms a PN junction with the substrate 100. In some embodiments, a material of the emitter 150 may be same as the material of the substrate 100.

In some embodiments, the solar cell further includes a second passivation layer 160, which is located on a surface of the emitter 150 away from the substrate 100. The second passivation layer 160 is configured to achieve good passivation effect on the second surface of the substrate 100, reduce the defect state density of the second surface and suppress the carrier recombination at the back surface of the substrate 100 well. The second passivation layer 160 can also achieve good anti-reflection effect, contributing to reduce reflection of incident light and improve the utilization rate of incident light.

In some embodiments, the second passivation layer 160 may be a single-layer structure. In some embodiments, the second passivation layer 160 may also be a multi-layer structure. In some embodiments, a material of the second passivation layer 160 may be at least one of silicon oxide, aluminum oxide, silicon nitride, or silicon oxynitride.

In some embodiments, the solar cell further includes a second electrode 170, which is located on the second surface of the substrate 100. The second electrode 170 penetrates through the second passivation layer 160 to be in electrical contact with the emitter 150.

In the solar cell provided by the above embodiments, the first passivation contact structure 110 is disposed in the metal pattern region and the second passivation contact structure 120 is covered on the first passivation contact structure 110, such that it is difficult for the metal electrode to penetrate through the first passivation contact structure 110 and the second passivation contact structure 120 mutually stacked, thereby reducing the probability that the metal electrode penetrates through to the substrate 100. On one hand, the second passivation contact structure 120 covers the top surface of the first passivation contact structure 110 and the first surface in the non-metal pattern region at the same time, such that the second passivation contact structure is a continuous film layer. In this way, the transverse transport performance of the second passivation contact structure 120 can be improved, and the capability of transporting the carriers from the non-metal pattern region to the metal pattern region can be enhanced, and the open-circuit voltage and the short-circuit current can be increased. Furthermore, the top surface of the second passivation contact structure 120 in the non-metal pattern region is made not higher than the top surface of the second passivation contact structure 120 in the metal pattern region. In this way, the thickness of the second passivation contact structure 120 in the non-metal pattern region is made smaller to prevent the second passivation contact structure 120 from generating strong parasitic light absorption capability for incident light, contributing to improve the absorption utilization rate of the non-metal pattern region of the first surface for incident light.

Figure 9:
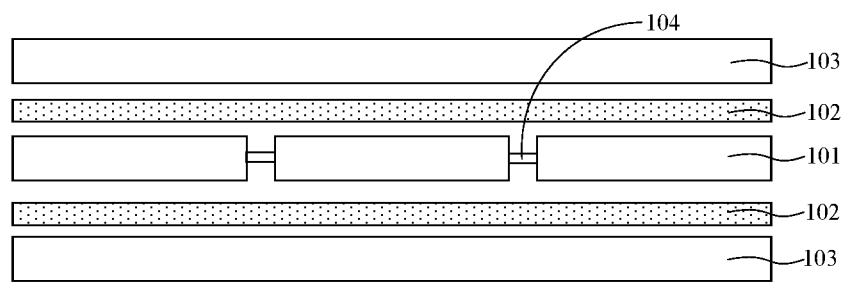
FIG. 9 is a structural schematic diagram illustrating a photovoltaic module according to an embodiment of the present disclosure.

According to another aspect of embodiments of the present disclosure, a photovoltaic module is provided. As shown in FIG. 9, the photovoltaic module includes a plurality of cell strings. Each of the plurality of cell strings is formed by connecting a plurality of solar cells, each of which is provided by the above embodiments. The photovoltaic module includes encapsulation layers 102, configured to cover surfaces of the plurality of cell strings. The photovoltaic module includes cover plates 103, configured to cover surfaces of the encapsulation layers 102 away from the plurality of cell strings. The plurality of solar cells are electrically connected in the form of an entire sheet or multiple split sheets, so as to form the plurality of cell strings which are electrically connected by series connection and/or parallel connection.

In some embodiments, two neighboring cell strings in the plurality of cell strings may be electrically connected by a conductive band 104. The encapsulation layers 102 cover the first surface and the back surface of the solar cells 101. Specifically, the encapsulation layer 102 may be an organic encapsulation glue film such as an ethylene-vinyl acetate copolymer (EVA) glue film, a polyolyaltha olfin elastomer (POE) glue film, a polyethylene terephthalate (PET) glue film or a polyvinyl butyral resin (PVB). In some embodiments, the cover plate may be a glass cover plate or a plastic cover plate or a cover plate having a light transmission function. Specifically, a surface of the cover plate 103 facing toward the encapsulation layer 102 may be an uneven surface for increasing a utilization rate of incident light.

The above descriptions are made as above with preferred embodiments, but these embodiments are not intended to limit the claims. Without departing from the application idea of the present disclosure, those skilled in the art can make several possible changes and modifications. Thus, the scope of protection of the present disclosure shall be defined by the appended claims.

Persons of ordinary skill in the art may understand that, the above embodiments are specific embodiments for implementation of the present disclosure and may be changed in form or details without departing from the spirit and scope of the present disclosure in practical applications. Those skilled in the art can make various changes and modifications within the spirit and scope of the present disclosure. Thus, the scope of protection of the present disclosure shall be defined by the claims.

What is claimed is:

1. A solar cell, comprising:
a substrate, having a first surface, wherein the first surface has a metal pattern region and, a non-metal pattern region, and a transitional region located between the metal pattern region and the non-metal pattern region; and wherein the metal pattern region, the non-metal pattern region and the transitional region form a step structure, wherein the transitional region is inclined relative to each of the metal pattern region and the non-metal pattern region;
a first passivation contact structure, located in the metal pattern region of the first surface, wherein the first passivation contact structure includes a first tunneling layer formed over the first surface and a first doped conductive layer formed over a side of the first tunneling layer facing away from the substrate; and
a second passivation contact structure, including a second tunneling layer formed over the first surface and a second doped conductive layer formed over a side of the second tunneling layer facing away from the substrate, wherein each of the second tunneling layer and the second doped conductive layer is a continuous film layer over the metal pattern region, the non-metal pattern region and the transitional region;
wherein the second passivation contact structure has a first portion over the non-metal pattern region of the first surface, a second portion over sidewalls and a top of the first passivation contact structure, and a third portion over the transitional region, and wherein a surface of the second tunneling layer facing the second doped conductive layer in the third portion is inclined relative to each of the metal pattern region and the non-metal pattern region;
wherein a doped element in each of the first doped conductive layer and the second doped conductive layer is of a same type as a doped element in the substrate.

2. The solar cell of claim 1, wherein a concentration of the doped element in the first doped conductive layer is greater than or equal to a concentration of the doped element in the second doped conductive layer.

3. The solar cell of claim 1, wherein a slope of a doping curve representing variation of doping concentration along a doping depth of the first doped conductive layer is less than a slope of a doping curve of the second doped conductive layer.

4. The solar cell of claim 1, wherein the first doped conductive layer has a concentration of the doped element in a range of $5\times10^{18}$ atoms/cm$^3$ to $1\times10^{21}$ atoms/cm$^3$, and the second doped conductive layer has a concentration of the doped element in a range of $5\times10^{18}$ atoms/cm$^3$ to $9\times10^{20}$ atoms/cm$^3$.

5. The solar cell of claim 1, wherein the first doped conductive layer has a thickness greater than or equal to a thickness of the second doped conductive layer.

6. The solar cell of claim 1, wherein the first doped conductive layer has a thickness in a range of 5 nm to 500 nm, and the second doped conductive layer has a thickness in a range of 1 nm to 200 nm.

7. The solar cell of claim 1, wherein the first tunneling layer has a thickness less than or equal to a thickness of the second tunneling layer.

8. The solar cell of claim 1, wherein the first tunneling layer has a thickness in a range of 0.1 nm to 5 nm, and the second tunneling layer has a thickness in a range of 0.2 nm to 10 nm.

9. The solar cell of claim 1, wherein the substrate has a second surface opposite to the first surface;
the first surface has a height in the non-metal pattern region lower than a height in the metal pattern region, and the height in the non-metal pattern region and the height in the metal pattern region are relative to the second surface.

10. The solar cell of claim 9, wherein a height difference between the height in the non-metal pattern region and the height in the metal pattern region is in a range of 0.1 μm to 10 μm.

11. The solar cell of claim 1, wherein the top surface of the first portion of the second passivation contact structure is lower than the top surface of the second portion of the second passivation contact structure.

12. The solar cell of claim 1, wherein an included angle between a surface of the third portion facing toward the substrate and the non-metal pattern region of the first surface is in a range of 90° to 160°.

13. The solar cell of claim 1, wherein the first passivation contact structure includes: a plurality of sub-first passivation contact structures sequentially stacked in the direction away from the substrate, and each of the plurality of sub-first passivation contact structures includes a first tunneling sub-layer and a first doped conductive sub-layer sequentially stacked in the direction away from the substrate.

14. The solar cell of claim 13, wherein the second passivation contact structure includes: a plurality of sub-second passivation contact structures sequentially stacked in the direction away from the substrate, and each of the plurality of sub-second passivation contact structures includes a second tunneling sub-layer and a second doped conductive sub-layer sequentially stacked in the direction away from the substrate.

15. The solar cell of claim 1, wherein the second passivation contact structure includes: a plurality of sub-second passivation contact structures sequentially stacked in the direction away from the substrate, and each of the plurality of sub-second passivation contact structures includes a second tunneling sub-layer and a second doped conductive sub-layer sequentially stacked in the direction away from the substrate.

16. The solar cell of claim 1, wherein the first passivation contact structure includes a plurality of sub-first passivation contact structures sequentially stacked in the direction away from the substrate, and each of the plurality of sub-first passivation contact structures includes a first tunneling sub-layer and a first doped conductive sub-layer sequentially stacked in the direction away from the substrate;

the second passivation contact structure includes a plurality of sub-second passivation contact structures sequentially stacked in the direction away from the substrate, and each of the plurality of sub-second passivation contact structures includes a second tunneling sub-layer and a second doped conductive sub-layer sequentially stacked in the direction away from the substrate;

wherein the plurality of sub-first passivation contact structures and the plurality of sub-second passivation contact structures are alternately stacked in the direction away from the substrate.

17. The solar cell of claim 1, wherein a roughness of the metal pattern region of the first surface is greater than a roughness of the non-metal pattern region of the first surface.

18. The solar cell of claim 1, further comprising: a first electrode which is electrically connected with the first doped conductive layer.

19. A photovoltaic module, comprising:
a plurality of cell strings, each formed by connecting a plurality of solar cells;
encapsulation layers, configured to cover surfaces of the plurality of cell strings;
cover plates, configured to cover surfaces of the encapsulation layers away from the plurality of cell strings;
wherein each of the plurality of solar cells comprises:
a substrate, having a first surface, wherein the first surface has a metal pattern region and, a non-metal pattern region, and a transitional region located between the metal pattern region and the non-metal pattern region; and wherein the metal pattern region, the non-metal pattern region and the transitional region form a step structure, wherein the transitional region is inclined relative to each of the metal pattern region and the non-metal pattern region;

a first passivation contact structure, located in the metal pattern region of the first surface, wherein the first passivation contact structure includes a first tunneling layer formed over the first surface and a first doped conductive layer formed over a side of the first tunneling layer facing away from the substrate; and a second passivation contact structure, including a second tunneling layer formed over the first surface and a second doped conductive layer formed over a side of the second tunneling layer facing away from the substrate, wherein each of the second tunneling layer and the second doped conductive layer is a continuous film layer over the metal pattern region, the non-metal pattern region and the transitional region;

wherein the second passivation contact structure has a first portion over the non-metal pattern region of the first surface, a second portion over sidewalls and a top of the first passivation contact structure, and a third portion over the transitional region, and wherein a surface of the second tunneling layer facing the second doped conductive layer in the third portion is inclined relative to each of the metal pattern region and the non-metal pattern region;

wherein a doped element in each of the first doped conductive layer and the second doped conductive layer is of a same type as a doped element in the substrate.

* * * * *